(12) United States Patent
Huang et al.

(10) Patent No.: US 9,730,358 B2
(45) Date of Patent: Aug. 8, 2017

(54) UNPOWERED AUXILIARY HEAT DISSIPATION APPARATUS AND DEVICE USING THE SAME

(71) Applicant: HON HAI PRECISION INDUSTRY CO., LTD., New Taipei (TW)

(72) Inventors: Shih-Chun Huang, New Taipei (TW); Jiunn-Her Li, New Taipei (TW); Chih-Peng Sung, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 829 days.

(21) Appl. No.: 14/185,937

(22) Filed: Feb. 21, 2014

(65) Prior Publication Data

US 2014/0246172 A1    Sep. 4, 2014

(30) Foreign Application Priority Data

Mar. 1, 2013    (TW) .................................. 102107199

(51) Int. Cl.
| | |
|---|---|
| F24H 3/02 | (2006.01) |
| F28F 25/10 | (2006.01) |
| H05K 7/20 | (2006.01) |
| F28D 1/02 | (2006.01) |

(52) U.S. Cl.
CPC ......... *H05K 7/20127* (2013.01); *F28D 1/024* (2013.01); *H05K 7/20172* (2013.01); *F28F 2250/08* (2013.01)

(58) Field of Classification Search
CPC . H05K 7/20127; H05K 7/20172; F28F 13/12; F28F 5/00; F28F 2250/08; F28D 1/024
See application file for complete search history.

(56) References Cited

U.S. PATENT DOCUMENTS

| | | | |
|---|---|---|---|
| 6,700,781 B2 * | 3/2004 | Chia-Kuan | ........... F04D 29/582 165/121 |
| 6,976,486 B2 * | 12/2005 | Thoma | ..................... F24J 3/003 126/247 |
| 7,136,285 B1 * | 11/2006 | Herbert | ................. F04D 29/281 165/121 |

(Continued)

FOREIGN PATENT DOCUMENTS

| | | |
|---|---|---|
| CN | 02127716.8 | 6/2005 |
| CN | 1967822 A | 5/2007 |

(Continued)

*Primary Examiner* — Ryan J Walters
*Assistant Examiner* — Jon T Schermerhorn
(74) *Attorney, Agent, or Firm* — Steven Reiss

(57) ABSTRACT

An exemplary heat dissipation apparatus includes a bracket, a reticular cover fixed to the bracket and a receiving space being defined with the bracket, and a tray received in the receiving space. The tray includes a first surface and a second surface. A number of first through holes is defined on the bracket. A number of second through holes is defined on the tray respectively corresponding to the first through holes, each of the second through holes extends obliquely from the first surface of the tray to the second surface of the tray relative to a vertical line of the first and second surfaces of the tray. A first magnet is installed on the first surface of the tray, a second magnet corresponding to the first magnet is installed on the bracket.

18 Claims, 6 Drawing Sheets

(56) References Cited

U.S. PATENT DOCUMENTS

| | | | | |
|---|---|---|---|---|
| 7,424,907 | B2* | 9/2008 | Chou | F28D 1/0477 165/104.33 |
| 7,836,939 | B2* | 11/2010 | Zimmerman | B25J 19/0054 165/104.19 |
| 2004/0114327 | A1* | 6/2004 | Sri-Jayantha | H01L 23/467 361/695 |
| 2005/0067272 | A1* | 3/2005 | Pelhos | C23C 14/225 204/192.12 |
| 2008/0164250 | A1* | 7/2008 | Lunneborg | H05B 6/108 219/672 |
| 2009/0145584 | A1* | 6/2009 | Walsh | F04D 29/582 165/122 |
| 2010/0177480 | A1* | 7/2010 | Koplow | F04D 25/0606 361/697 |
| 2011/0030929 | A1* | 2/2011 | Powell | F02M 31/20 165/121 |
| 2011/0103011 | A1* | 5/2011 | Koplow | F04D 25/0606 361/679.54 |
| 2013/0248149 | A1* | 9/2013 | Kim | F28F 7/00 165/104.19 |
| 2013/0323099 | A1* | 12/2013 | Li | F04B 39/08 417/413.1 |

FOREIGN PATENT DOCUMENTS

| | | |
|---|---|---|
| CN | 100454528 C | 1/2009 |
| CN | 101370373 A | 2/2009 |
| CN | 102056452 A | 5/2011 |
| CN | 102112939 A | 6/2011 |
| JP | 2006320887 A | 11/2006 |
| KR | 20000050679 A | 8/2000 |
| TW | 200844724 A | 11/2008 |

* cited by examiner

UNPOWERED AUXILIARY HEAT DISSIPATION APPARATUS AND DEVICE USING THE SAME

BACKGROUND

1. Technical Field

The present disclosure relates to a heat dissipation apparatus, and more particularly to an unpowered auxiliary heat dissipation apparatus.

2. Description of Related Art

A heat dissipation apparatus is usually applied to keep an electronic device from over heating. A traditional heat dissipation apparatus uses a fan to dissipate the heat from the electronic device for cooling the electronic device and protecting electronic elements in the electronic device from being damaged by high temperature. Most fans need to be driven by a motor, however, when the motor is operating at high speed, more heat will be generated, which will affect the performance of the heat dissipation apparatus.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
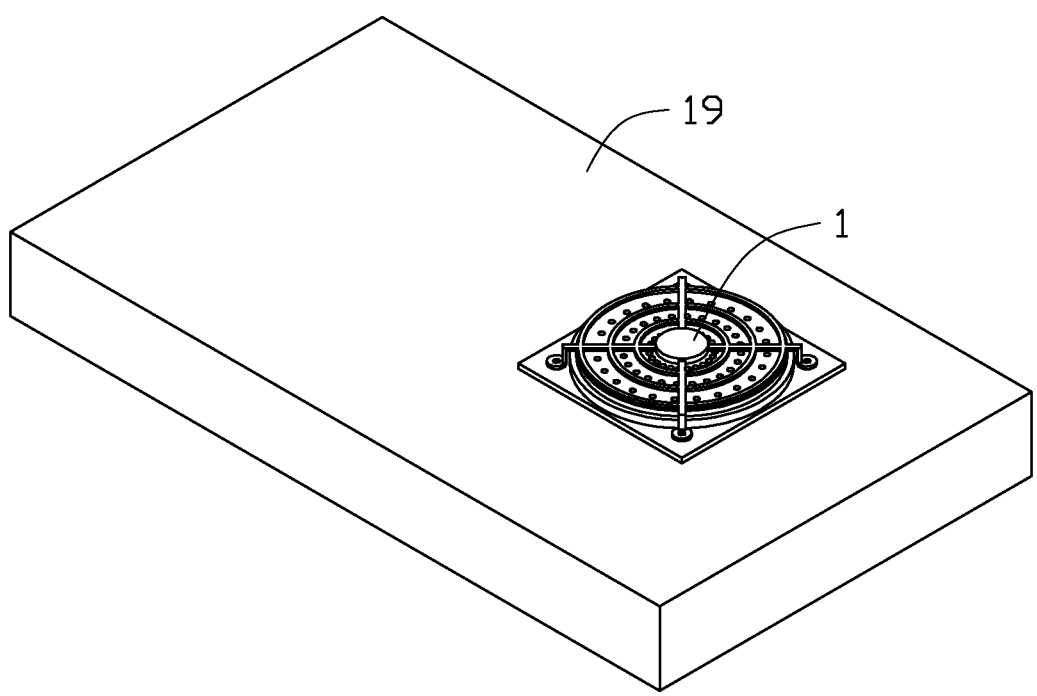
FIG. 1 is an isometric view of an electronic device in accordance with an exemplary embodiment of the present disclosure, including a heat dissipation apparatus.

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one."

FIG. 1 is a perspective view of an electronic device in accordance with an exemplary embodiment of the present disclosure. The electronic device includes a housing 19 and a heat dissipation apparatus 1 located in the housing 19. The heat dissipation apparatus 1 is used to dissipate heat from the housing 19, for cooling the electronic device. In the embodiment, the electronic device is a switch. In other embodiments, the electronic device can be a computer, for example.

Figure 2:
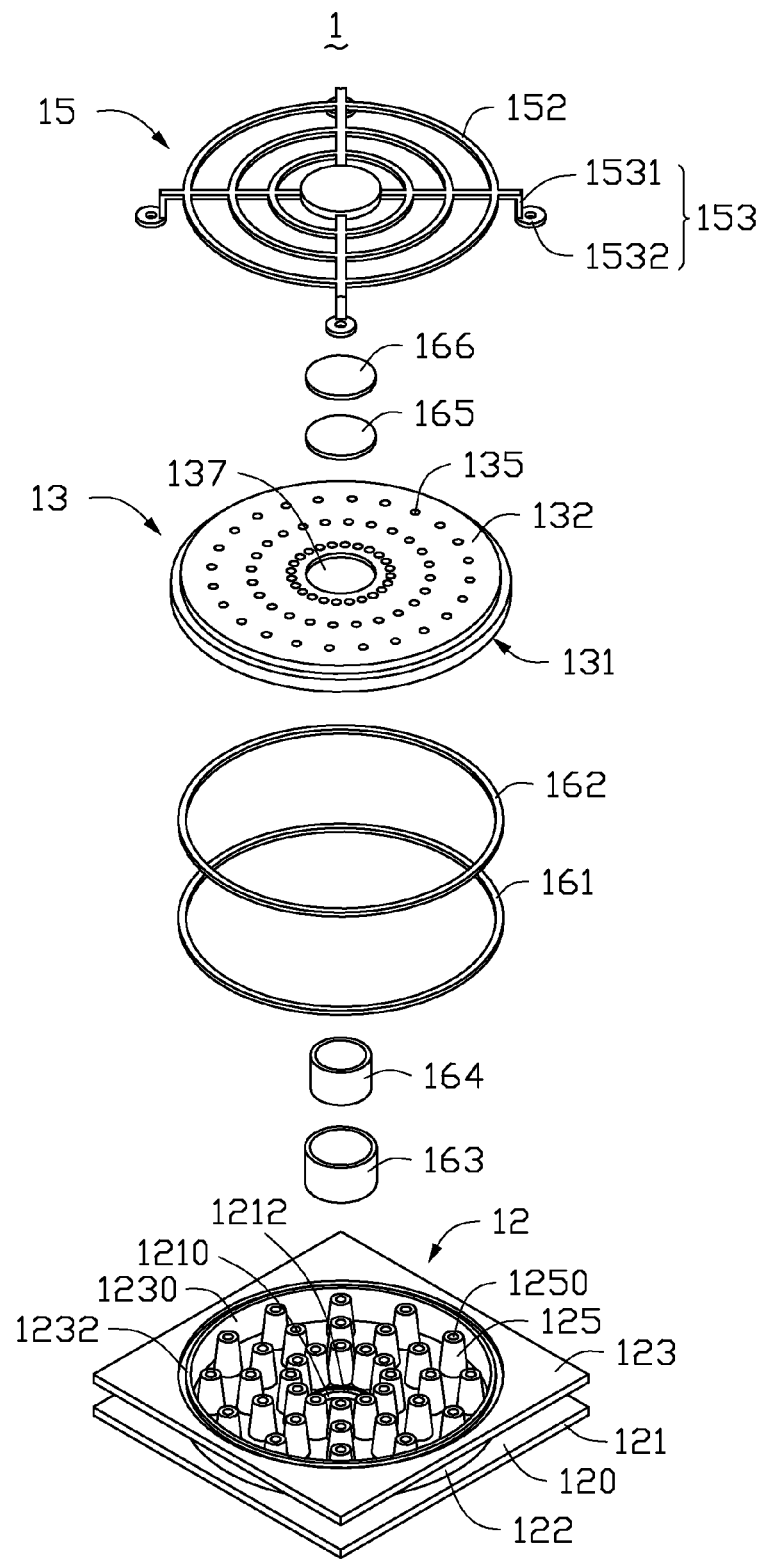
FIG. 2 is an exploded, isometric view of the heat dissipation apparatus in FIG. 1.
Figure 3:
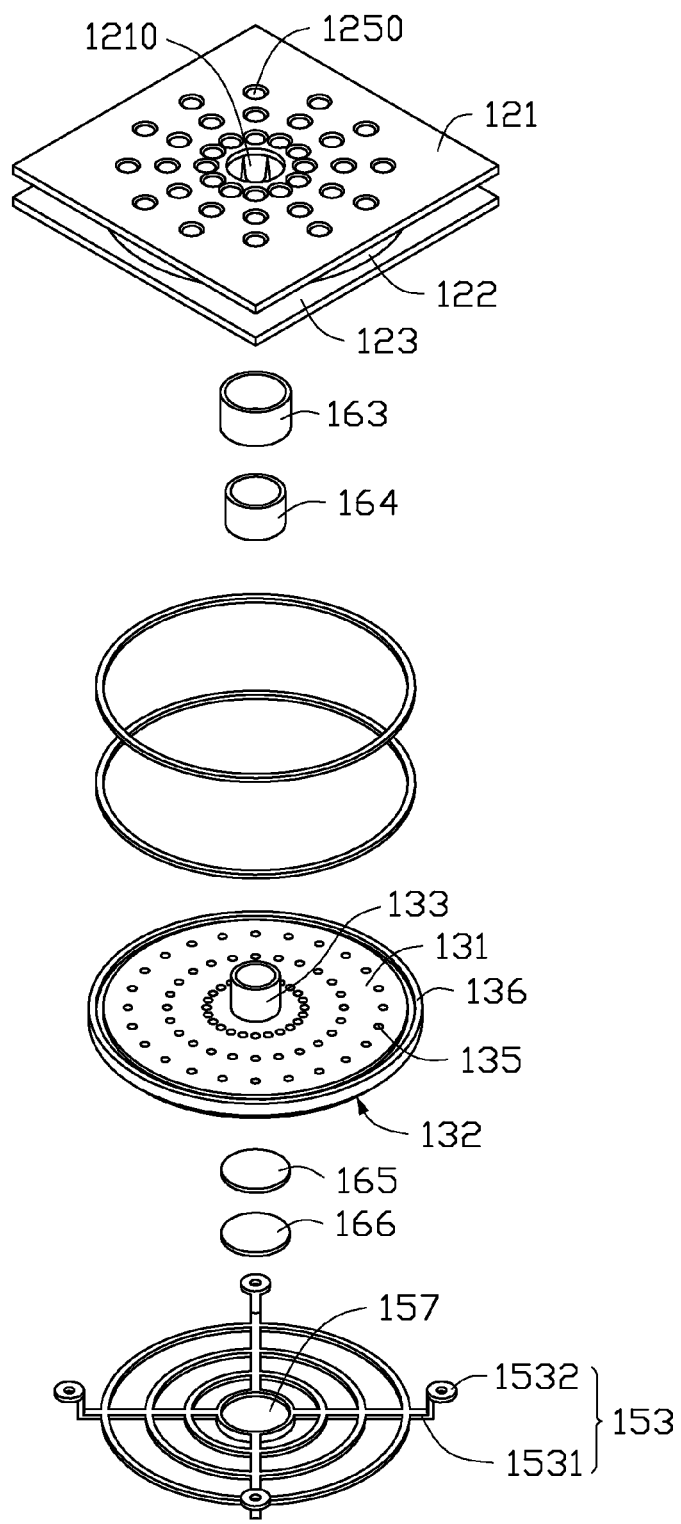
FIG. 3 is an inverted view of the heat dissipation in FIG. 2.
Figure 4:
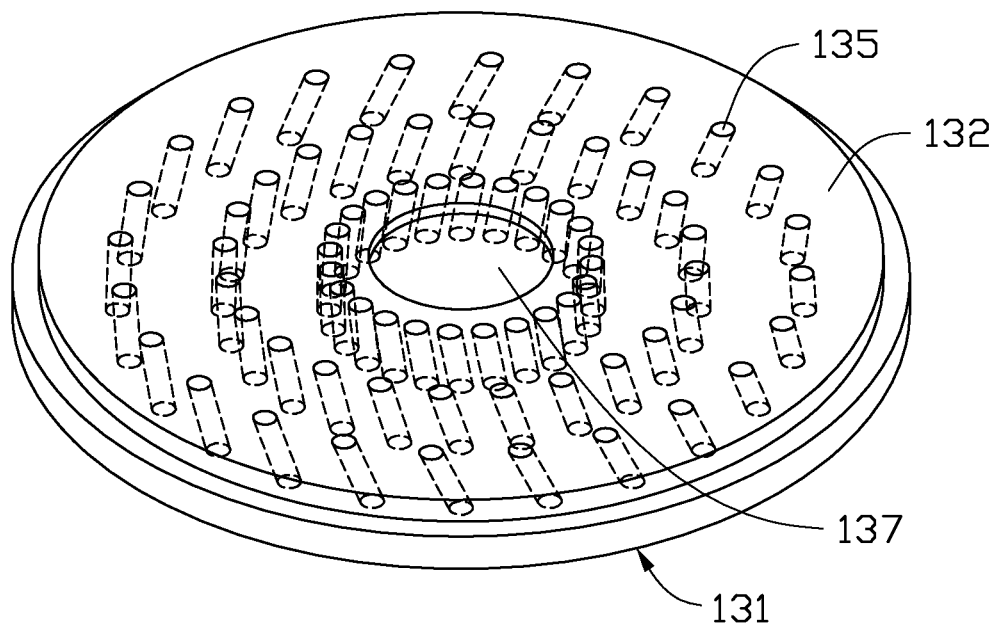
FIG. 4 is a perspective view of a tray of the heat dissipation apparatus shown in FIG. 2.
Figure 5:
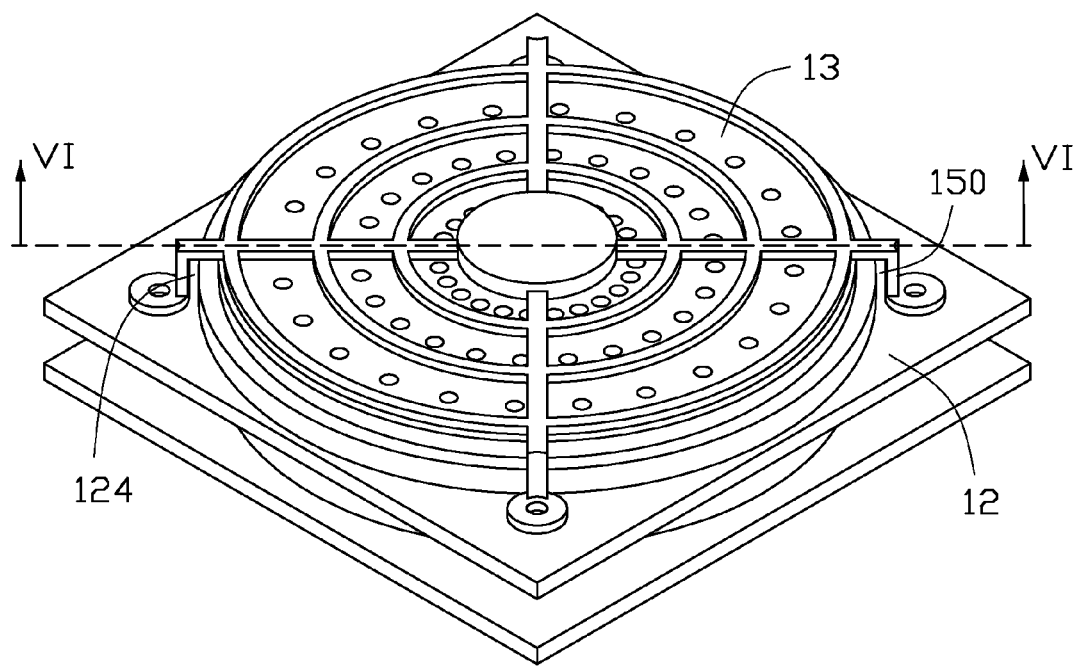
FIG. 5 is an assembled view of the heat dissipation apparatus of FIG. 2.

FIGS. 2, 3 and 5 show that the heat dissipation apparatus 1 includes a bracket 12, a tray 13 and a reticular cover 15. The reticular cover 15 is fixed on the bracket 12 and defines a receiving space 124 with the bracket 12. The tray 13 is received in the receiving space 124 and rotates relative to the bracket 12.

The bracket 12 includes a base 121, a sleeve 122, a cover plate 123 and a plurality of pillars 125. The sleeve 122 is located between and connects the base 121 and the cover plate 123. The cover plate 123 defines a first opening 1230 exposing the inside of the sleeve 122 to the outside of the cover plate 123. A first ring slot 1232 is placed around the first opening 1230, and a first ring-shaped magnet 161 is placed in the first ring slot 1232. The base 121 defines a circle-shaped opening 1210 allowing the inside of the sleeve 122 in communication with the outside of the base 121. A slot 1212 is defined on the base 121, communicating with and encircling the circle-shaped opening 1210. The slot 1212 and the circle-shaped opening 1210 cooperatively form a step structure. A first sleeve-shaped magnet 163 is fixed in the slot 1212. The first opening 1230 and the sleeve 122 are coaxial with the central vertical axis of the circle-shaped opening 1210. The cover plate 123, the sleeve 122 and the base 121 cooperatively form a groove 120 on the outside of the sleeve 122, and the groove 120 is used in assembling the heat dissipation apparatus 1 to a device needing heat dissipation. That is, the shapes of the first opening 1230, the first ring slot 1232 and the circle-shaped opening 1210 can be changed according to the shape and application of the magnet 161.

The plurality of pillars 125 are placed on the base 121 and are received inside the sleeve 122. The plurality of pillars 125 are circularly placed at least once around the circle-shaped opening 1210. In the embodiment, the plurality of pillars 125 are placed around the circle-shaped opening 1210 three rows from the center of the circle-shaped opening 1210 to the periphery, and the pillars 125 placed on each row are equally angularly spaced from each other. The pillars 125 on one row respectively align with the pillars 125 on other two rows to form a line which is collinear with the radius of the circle-shaped opening 1210. A plurality of first through holes 1250 is defined on the bracket 12, the plurality of first through holes 1250 respectively corresponds to the plurality of pillars 125, and each of the plurality of first through holes 1250 runs though the corresponding pillar 125 and base 121 communicating the each side of the tray 13. In other words, the plurality of pillars 125 radiate in a radius direction of the circle-shaped opening 1210. In the embodiment, a density distribution of the pillars 125 gradually decreases in an extending direction of the radius of the circle-shaped opening 1210.

The tray 13 includes a first surface 131 and a second surface 132 opposite to the first surface 131, the first surface 131 is adjacent to the cover plate 123. The tray 13 defines a central vertical axis, which is regarded as axis of rotation. A guiding pillar 125 is located on the first surface 131 of the tray 13, coaxial with the central vertical axis of the tray 13. A second sleeve-shaped magnet 164 is placed on periphery of the guiding pillar 125. When the guiding pillar 125 with the second sleeve-shaped magnet 164 is located in the first sleeve-shaped magnet 163 and placed in the first ring slot 1232, the first sleeve-shaped magnet 163 and the second sleeve-shaped magnet 164 repel each other. The first surface 131 of the tray 13 has a second ring slot 136 corresponding to the first ring slot 1232, a second ring-shaped magnet 162 is fixed into the second ring slot 136. The first ring-shaped magnet 161 and the second ring-shaped magnet 162 repel each other. A first circle-shaped slot 1212 corresponding to the guiding pillar 125 is placed in the second surface 132 of the tray 13, and a first circle plate-shaped magnet 165 is fixed into the first circle-shaped slot 137.

A plurality of second through holes 135 is defined on the tray 13 and each of the plurality of second through holes 135 extend obliquely from the first surface 131 of the tray 13 to the second surface 132 of the tray 13 relative to a vertical line of the tray 13. The plurality of second through holes 135 are arranged at least one row around the guiding pillar 125. The rows defined by the second through holes 135 respectively correspond to the rows defined by the first through holes 1250. In the embodiment, the plurality of second through holes 135 are arranged three rows around the guiding pillar 125, a density of the second through holes 135 of each row is higher than a density of the first through holes 1250 of the corresponding row. The second through holes 135 of each row are equally angularly spaced from each other.

The reticular cover 15 includes a reticular surface 152 and a support 153 extending from an edge of the reticular surface 152. The reticular surface 152 is adjacent to the second surface 132 of the tray 13. The reticular surface 152 has a second circle-shaped slot 157 corresponding to the first circle-shaped slot 137. A second circle plate-shaped magnet 166 is fixed into the second circle-shaped slot 157. The first circle plate-shaped magnet 165 and the second circle plate-shaped magnet 166 repel each other. The reticular cover 15 is fixed on the bracket 12 via the support 153. In the embodiment, the support 153 includes a connecting portion 1531 and a fixed portion 1532. The connecting portion 1531 is located between and connects the reticular surface 152 and the fixed portion 1532. The connecting portion 1531 and the fixed portion 1532 cooperatively define an L-shaped structure. The reticular cover 15 is fixed on the cover plate 123 of the bracket 12 via the fixed portion 1532.

Figure 6:
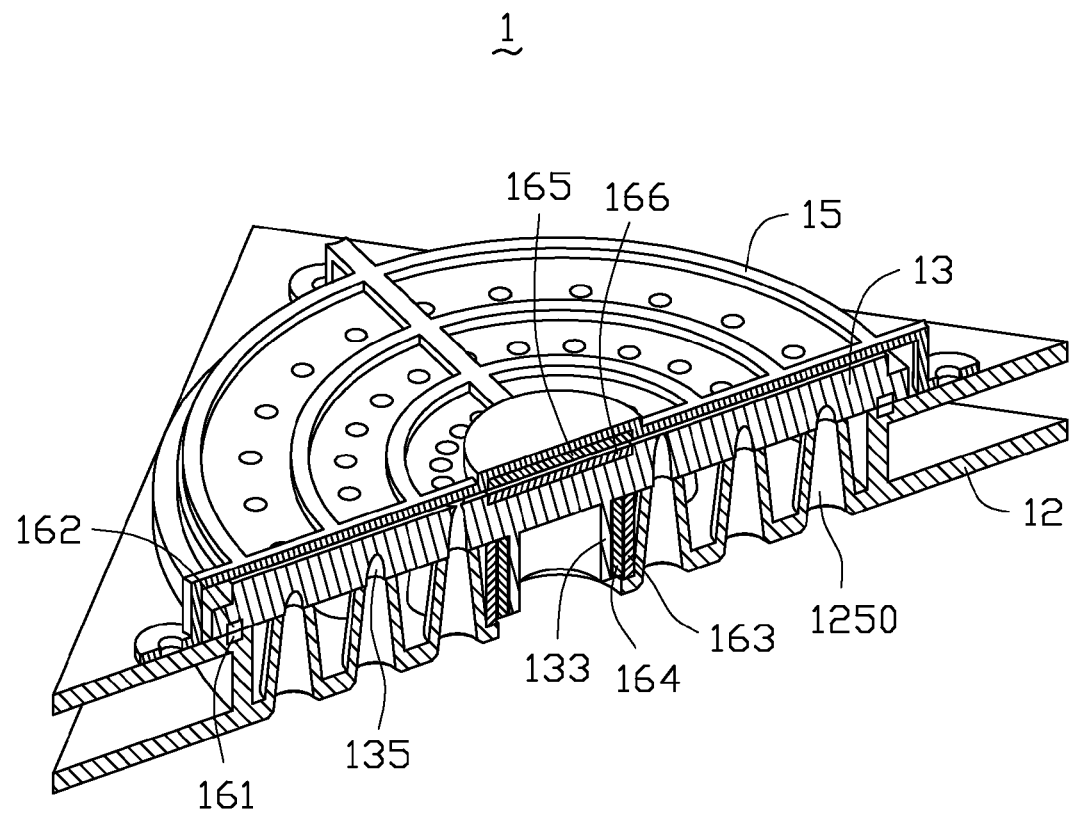
FIG. 6 is a cross-sectional view of the heat dissipation apparatus of FIG. 5, corresponding to line VI-VI.

FIGS. 5-6 show that in assembly of the heat dissipation apparatus 1, the first ring-shaped magnet 161 is fixed into the first ring slot 1232. The second ring-shaped magnet 162 is fixed into the second ring-shaped slot 136. The first sleeve-shaped magnet 163 is fixed into the slot 1212. The second sleeve-shaped magnet 164 is placed on the periphery of the guiding pillar 125. The first circle plate-shaped magnet 165 is fixed into the first circle-shaped slot 137, and the second circle plate-shaped magnet 166 is fixed into the second circle-shaped slot 157. The tray 13 is located on the cover plate 123 of the bracket 12 with the guiding pillar 125 and the second sleeve-shaped magnet 164 is cooperatively received in the first sleeve-shaped magnet 163. The reticular cover 15 is place on the cover plate 123 of the bracket 12 with the support 153 of the reticular cover 15 surrounding the periphery of the tray 13, allowing the tray 13 to be received in the receiving space 124 defined by the reticular cover 15 and the bracket 12. The first through holes 1250 are defined in rows respectively correspond to the rows of the second through holes 135.

The combination of the repulsive forces between the first ring-shaped magnet 161 and the second ring-shaped magnet 162, the repulsive force between the first circle plate-shaped magnet 165 and the second circle plate-shaped magnet 166 and the repulsive force between the first sleeve-shaped magnet 163 and the second sleeve-shaped magnet 164 rotate the tray 13 freely in the receiving space 124 between the reticular cover 15 and the bracket 12.

The heat dissipating apparatus 1 described above can operate without power, that is, when use the heat dissipating apparatus 1 is fixed on the housing 19 of the electronic by screw or other means to cool the electronic device. In the embodiment, the heat dissipation apparatus 1 is fixed on the housing 19 of the electronic device by the engagement of the groove 120 formed by the cover plate 123, the sleeve 122, the base 121 and a wall of the housing 19. When a temperature difference exists between the inside of the housing 19 and the outside of housing 19, the density of air between the inside of the housing 19 and the outside of housing 19 is different. A volume of the inside air of the housing 19 gradually expands as the inside temperature of the housing 19 increases, which causes the inside air of the housing 19 to diffuses outward to the outside of the housing 19. Then the low temperature air outside of the housing 19 diffuses inward to the inside of the housing 19, the high temperature will cause the new supplementary air to diffuse outward to the outside of the housing 19 again, so as the air between the inside of the housing 19 and the outside of the housing 19 is circulating. The heat of the housing 19 will be dissipated and cool the electronic device.

The air of the housing 19 flows through the heat dissipation apparatus 1 by passing through the first through holes 1250 and through the second through holes 135, when the temperature difference exceeds 0.5 degrees. Because the second through holes 135 extend obliquely from the first surface of the tray 13 to the second surface 132 of the tray 13 relative to a vertical line of the first and second surfaces of the tray 13, a force to rotate the tray 13 is applied by the air. The rotation of the tray 13 causes the airflow rate inside of the housing 19 to be different then the airflow rate outside of the housing 19, which can increase air exchange rate inside of the housing 19 and improve the cooling performance.

The heat dissipation apparatus 1 of the present disclosure does not need electric power. Because of the air convection between the temperature difference and the oblique second through holes 135, when the air passes though the second through hole, the air applies a force on the tray 13 and rotates the tray 13, so that the cooling performance is improved.

Although various features and elements are described as embodiments in particular combinations, each feature or element can be used alone or in other various combinations within the principles of the present disclosure to the full extent indicated by the broad general meaning of the terms in which the appended claims are expressed.

What is claimed is:

1. A heat dissipation apparatus comprising:
a bracket;
a reticular cover fixed to the bracket, the reticular cover and the bracket cooperatively defining a receiving space; and
a tray received in the receiving space and rotating relative to the bracket, the tray comprising a first surface facing to the bracket and a second surface opposite to the first surface, and the tray regarding a central vertical axis of the first surface and second surface as axis of rotation;
wherein a plurality of first through holes are defined on the bracket, a plurality of second through holes are defined on the tray and respectively corresponds to the plurality of first through holes, each of the plurality of second through holes extends obliquely from the first surface of the tray to the second surface of the tray relative to a vertical line of the first and second surfaces of the tray, the plurality of second through holes are arranged in at least one row around the central vertical axis, and the plurality of first through holes are placed in at least one row around the central vertical axis, and
wherein the first surface of the tray is installed with a first magnet, the bracket is installed with a second magnet corresponding to the first magnet, the tray is supported on the bracket by the repulsive force between the first magnet and the second magnet.

2. The heat dissipation apparatus of claim 1, wherein the bracket comprises a base, a sleeve, a cover plate and a plurality of pillars, the sleeve perpendicularly connecting the base and the cover plate, the cover plate is adjacent to the first surface of the tray, the cover plate defines a first opening exposing an inside of the sleeve to an outside of the cover plate, the plurality of first through holes correspond to the plurality of pillars, and each of the plurality of first through holes runs though the corresponding pillar.

3. The heat dissipation apparatus of claim 2, wherein the base defines a circle-shaped opening allowing the inside of the sleeve communication with and the outside of the base and a slot communicating with and encircling the circle-shaped opening, a first sleeve-shaped magnet is fixed into the slot, the first surface of the tray is placed with a guiding pillar, the guiding pillar and the slot of the base are coaxial with the central vertical axis of the tray, a second sleeve-shaped magnet is placed on periphery of the guiding pillar, the guiding pillar with the second sleeve-shaped magnet is received in the first sleeve-shaped magnet, and first sleeve-shaped magnet and the second sleeve-shaped magnet repel each other.

4. The heat dissipation apparatus of claim 3, wherein the reticular cover comprises a reticular surface and a support extending from an edge of the reticular surface, the support is fixed on the cover plate, the reticular surface, the support and the cover plate cooperatively define the receiving space, and the reticular surface is adjacent to the tray received in the receiving space.

5. The heat dissipation apparatus of claim 4, wherein a first circle-shaped slot corresponding to the guiding pillar is placed in the second surface of the tray, a second circle-shaped slot corresponding to the first circle-shaped slot is placed in the reticular surface, a first circle plate-shaped magnet is placed into the first circle-shaped slot, a second circle plate-shaped magnet is placed into the second circle-shaped slot, the first circle plate-shaped magnet and the second circle plate-shaped magnet repel each other.

6. The heat dissipation apparatus of claim 5, wherein the first magnet and the second magnet are a ring-shaped magnet, a first ring slot is placed around the first opening of the cover plate, a second ring slot is placed on the first surface of the tray corresponding to the first ring slot, the first ring-shaped magnet is placed into the first ring slot, and the second ring-shaped magnet is placed in the second ring slot.

7. The heat dissipation apparatus of claim 2, wherein the plurality of pillars are placed in three rows around the circle-shaped opening, the pillars placed in each row are equally angularly spaced from each other, the plurality of second through holes are placed in three rows around the guiding pillar, the second through holes placed in each row are equally angularly spaced from each other, the pillars in one row respectively align with the pillars in other two rows to form a line which is collinear with the radius of the circle-shaped open, the second through holes in one row respectively align with the second through holes in other two rows to form a line which is collinear with the radius of the guiding pillar.

8. The heat dissipation apparatus of claim 2, wherein the cover plate, the sleeve and the base cooperatively form a groove on the outside of the sleeve, the groove is used in assembling the heat dissipation apparatus to a device needing heat dissipation.

9. The heat dissipation apparatus of claim 1, wherein a density of the second through holes in each row is higher than a density of the first through holes of a corresponding row.

10. An electronic device comprising:
a housing; and
a heat dissipation apparatus received in the housing, the heat dissipation apparatus comprising:
a bracket;
a reticular cover fixed to the bracket, the reticular cover and the bracket cooperatively defining a receiving space; and
a tray received in the receiving space and rotating relative to the bracket, the tray comprising a first surface facing to the bracket and a second surface opposite to the first surface, and the tray regarding a central vertical axis of the first surface and second surface as axis of rotation;
wherein a plurality of first through holes are defined on the bracket, a plurality of second through holes are defined on the tray and respectively corresponds to the plurality of first through holes, each of the plurality of second through holes extends obliquely from the first surface of the tray to the second surface of the tray relative to a vertical line of the first and second surfaces of the tray, the plurality of second through holes are arranged in at least one row around the central vertical axis, and the plurality of first through holes are placed in at least one row around the central vertical axis, and
wherein the first surface of the tray is installed with a first magnet, the bracket is installed with a second magnet corresponding to the first magnet, the tray is supported on the bracket by the repulsive force between the first magnet and the second magnet.

11. The heat dissipation apparatus of claim 10, wherein the bracket comprises a base, a sleeve, a cover plate and a plurality of pillars, the sleeve perpendicularly connected between the base and the cover plate, the cover plate is adjacent to the first surface of the tray, the cover plate defines a first opening exposing an inside of the sleeve to an outside of the cover plate, the plurality of first through holes correspond to the plurality of pillars, and each of the plurality of first through holes runs though the corresponding pillar.

12. The heat dissipation apparatus of claim 11, wherein the base defines a circle-shaped opening allowing the inside of the sleeve communication with and the outside of the base and a slot communicating with and encircling the circle-shaped opening, a first sleeve-shaped magnet is fixed into the slot, the first surface of the tray is placed with a guiding pillar, the guiding pillar and the slot of the base are coaxial with the central vertical axis of the tray, a second sleeve-shaped magnet is placed on periphery of the guiding pillar, the guiding pillar with the second sleeve-shaped magnet is received in the first sleeve-shaped magnet, and first sleeve-shaped magnet and the second sleeve-shaped magnet repel each other.

13. The heat dissipation apparatus of claim 12, wherein the reticular cover comprises a reticular surface and a support extending from an edge of the reticular surface, the support is fixed on the cover plate, the reticular surface, the support and the cover plate cooperatively define the receiving space, and the reticular surface is adjacent to the tray received in the receiving space.

14. The heat dissipation apparatus of claim 13, wherein a first circle-shaped slot corresponding to the guiding pillar is placed in the second surface of the tray, a second circle-shaped slot corresponding to the first circle-shaped slot is placed in the reticular surface, a first circle plate-shaped magnet is placed into the first circle-shaped slot, a second circle plate-shaped magnet is placed into the second circle-shaped slot, the first circle plate-shaped magnet and the second circle plate-shaped magnet repel each other.

15. The heat dissipation apparatus of claim 14, wherein the first magnet and the second magnet are a ring-shaped magnet, a first ring slot is placed around the first opening of the cover plate, a second ring slot is placed on the first surface of the tray corresponding to the first ring slot, the first ring-shaped magnet is placed into the first ring slot, and the second ring-shaped magnet is placed in the second ring slot.

16. The heat dissipation apparatus of claim 11, wherein the plurality of pillars are placed in three rows around the circle-shaped opening, the pillars placed in each row are equally angularly spaced from each other, the plurality of second through holes are placed in three rows around the guiding pillar, the second through holes placed in each row are equally angularly spaced from each other, the pillars in one row respectively align with the pillars in other two rows to form a line which is collinear with the radius of the circle-shaped open, the second through holes in one row respectively align with the second through holes in other two rows to form a line which is collinear with the radius of the guiding pillar.

17. The heat dissipation apparatus of claim 11, wherein the cover plate, the sleeve and the base cooperatively form a groove on the outside of the sleeve, the groove is used in assembling the heat dissipation apparatus to a device needing heat dissipation.

18. The heat dissipation apparatus of claim 10, wherein a density of the second through holes on each row is higher than a density of the first through holes of a corresponding row.

* * * * *